(12) United States Patent
Wang et al.

(10) Patent No.: US 12,282,069 B2
(45) Date of Patent: Apr. 22, 2025

(54) SYSTEMS AND METHODS FOR DIAGNOSING HEALTH OF A BATTERY USING IN-VEHICLE IMPEDANCE ANALYSIS

(71) Applicant: GM GLOBAL TECHNOLOGY OPERATIONS LLC, Detroit, MI (US)

(72) Inventors: Yue-Yun Wang, Troy, MI (US); Steven Earl Muldoon, Royal Oak, MI (US); Lei Hao, Troy, MI (US); Michael P Barker, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 738 days.

(21) Appl. No.: 17/647,962

(22) Filed: Jan. 13, 2022

(65) Prior Publication Data
US 2023/0221375 A1  Jul. 13, 2023

(51) Int. Cl.
*G01R 31/392* (2019.01)
*H01M 10/48* (2006.01)

(52) U.S. Cl.
CPC .......... *G01R 31/392* (2019.01); *H01M 10/48* (2013.01); *H01M 2220/20* (2013.01)

(58) Field of Classification Search
CPC ............................. G01R 31/392; H01M 10/48
See application file for complete search history.

(56) References Cited

U.S. PATENT DOCUMENTS

2016/0109525 A1\* 4/2016 Chau .................... G01R 31/392
324/426

\* cited by examiner

*Primary Examiner* — Robert Grant
(74) *Attorney, Agent, or Firm* — Lorenz & Kopf LLP

(57) ABSTRACT

Systems and methods for diagnosing health of a battery using in-vehicle impedance analysis. The method includes receiving a sensed current measurement for a cell of the battery; generating a current profile as a function of the sensed current measurement, including pulses to a peak current, the pulses having a pulse frequency (w); applying a current with the current profile to the cell; for each pulse in the current profile, receiving a voltage measurement for the cell that is responsive to the pulse, calculating an impedance for the cell responsive thereto, the impedance comprising a real component at the pulse frequency (RZw), and an imaginary component at the pulse frequency (IZw), identifying a battery health problem when either RZw exceeds a preprogrammed first threshold for the pulse frequency, or when IZw exceeds a preprogrammed second threshold for the pulse frequency, and storing the RZw and the IZw for the cell.

20 Claims, 4 Drawing Sheets

SYSTEMS AND METHODS FOR DIAGNOSING HEALTH OF A BATTERY USING IN-VEHICLE IMPEDANCE ANALYSIS

TECHNICAL FIELD

The present disclosure generally relates to batteries in vehicle platforms, and more particularly relates to systems and methods for diagnosing health of a battery using in-vehicle impedance analysis.

A variety of pure electric and hybrid electric vehicle platforms rely on at least one onboard battery pack. As with any onboard component, there is a need to diagnose its health from time to time. Battery health and performance are generally characterized by the impedance of its component battery cells. An available method to measure impedance of a battery cell includes electrochemical spectrum analysis. However, this method usually requires a lab impedance analyzer that can be very expensive and is often too cumbersome to use on a battery that is installed in a vehicle.

The following disclosure provides a technological solution to these technical problems, in addition to addressing related issues. Furthermore, other desirable features and characteristics of the systems and methods will become apparent from the subsequent detailed description and the appended claims, taken in conjunction with the accompanying drawings and the preceding background.

SUMMARY

An embodiment is a method for diagnosing health of a battery using in-vehicle impedance analysis, the method comprising: receiving a sensed current measurement for at least one cell of the battery; generating a current profile as a function of the sensed current measurement, the current profile including multiple pulses to a peak current, the multiple pulses having a pulse frequency; applying a current with the current profile to the at least one cell; responsive to a pulse in the current profile, receiving a voltage measurement for the at least one cell, calculating a respective impedance for the at least one cell based thereon, the impedance including a real component at the pulse frequency and an imaginary component at the pulse frequency, storing the real component at the pulse frequency and the imaginary component at the pulse frequency for the at least one cell, and identifying a battery health problem when either the real component at the pulse frequency exceeds a preprogrammed first threshold for the pulse frequency, or when the imaginary component at the pulse frequency exceeds a preprogrammed second threshold for the pulse frequency.

In an embodiment, further including, for each pulse of the multiple pulses in the current profile, repeating the receiving, calculating, storing, and identifying.

In an embodiment, further including: calculating an average real component at the pulse frequency; and identifying the battery health problem further when the real component at the pulse frequency exceeds the average real component at the pulse frequency by more than a first threshold.

In an embodiment, further including: calculating an average imaginary component at the pulse frequency; and further identifying the battery health problem when the imaginary component at the pulse frequency exceeds the average imaginary component at the pulse frequency by more than a second threshold.

In an embodiment, further including applying the current with the current profile to the at least one cell either by commanding an on-board charging module (OBCM) in accordance with the current profile, or by utilizing pulse width modulation (PWM) to control a respective switch coupled across the at least one cell.

In an embodiment, wherein the pulse frequency is one of a plurality of pulse frequencies, and further including generating the current profile to further include a respective series of pulses to the peak current at each of the plurality of pulse frequencies.

In an embodiment, wherein the plurality of pulse frequencies covers an entire low to high frequency response range of a battery, including 0.1 Hz, 10 Hz, 100 Hz, and 1 KHz.

In an embodiment, further including: determining a battery type for the battery; and generating the current profile further as a function of the battery type.

In an embodiment, further including, determining an error between the sensed current measurement and the peak current; and generating the current profile further as a function of the error.

In an embodiment, further including: processing the real component at the pulse frequency and the imaginary component at the pulse frequency using a classification technique to thereby obtain a fault type from among internal short, diffusion problem, and layer aging.

In an embodiment, wherein the classification technique is a trained convergent neural net, a random forest search, or historical data mining.

In an embodiment, further including: storing the real component at the pulse frequency and the imaginary component at the pulse frequency of the at least one cell further with a respective temperature and state of charge, in a historical data storage; and identifying the battery health problem further as a function of detected variations in the real component at the pulse frequency or the imaginary component at the pulse frequency over time.

In another embodiment, is a system for diagnosing health of a battery using in-vehicle impedance analysis, the system including: a sensor configured to provide a sensed current measurement for at least one cell of the battery; a processor operationally coupled to the sensor and programmed to: receive the sensed current measurement; generate a current profile as a function of the sensed current measurement, the current profile including pulses to a peak current, the pulses having a pulse frequency; apply a current with the current profile to the at least one cell; responsive to a pulse in the current profile, receive a voltage measurement for the at least one cell, calculate an impedance for the at least one cell based thereon, the impedance including a real component at the pulse frequency and an imaginary component at the pulse frequency, store the real component at the pulse frequency and the imaginary component at the pulse frequency for the at least one cell, and identify a battery health problem when either the real component at the pulse frequency exceeds a preprogrammed first threshold for the pulse frequency, or when the imaginary component at the pulse frequency exceeds a preprogrammed second threshold for the pulse frequency.

In an embodiment, wherein the processor is further programmed to apply the current with the current profile to the at least one cell either by commanding an on-board charging module (OBCM) in accordance with the current profile, or by utilizing pulse width modulation (PWM) to control a respective switch coupled across the at least one cell.

In an embodiment, wherein the processor is further programmed to: for each pulse of the current profile, repeat the receiving, calculating, storing, and identifying.

In an embodiment, wherein the processor is further programmed to: calculate an average real component at the pulse frequency; and identify the battery health problem further when the real component at the pulse frequency exceeds the average real component at the pulse frequency by more than a first threshold.

In an embodiment, wherein the processor is further programmed to: calculate an average imaginary component at the pulse frequency; and identify the battery health problem further when the imaginary component at the pulse frequency exceeds the average imaginary component at the pulse frequency by more than a second threshold.

In an embodiment, wherein the pulse frequency, w, is one of a plurality of pulse frequencies, and wherein the processor is further programmed to generate the current profile to further include a respective series of pulses to the peak current at each of the plurality of pulse frequencies.

In an embodiment, wherein the processor is further programmed to: determine an error between the sensed current measurement and the peak current; generate the current profile further as a function of the error; store the real component at the pulse frequency and the imaginary component at the pulse frequency of the at least one cell further with a respective temperature and state of charge, in a historical data storage; and identify the battery health problem further as a function of detected variations in the real component at the pulse frequency or the imaginary component at the pulse frequency over time.

In an embodiment, further including: processing the real component at the pulse frequency and the imaginary component using a classification technique to thereby obtain a fault type from among internal short, diffusion problem, and layer aging.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
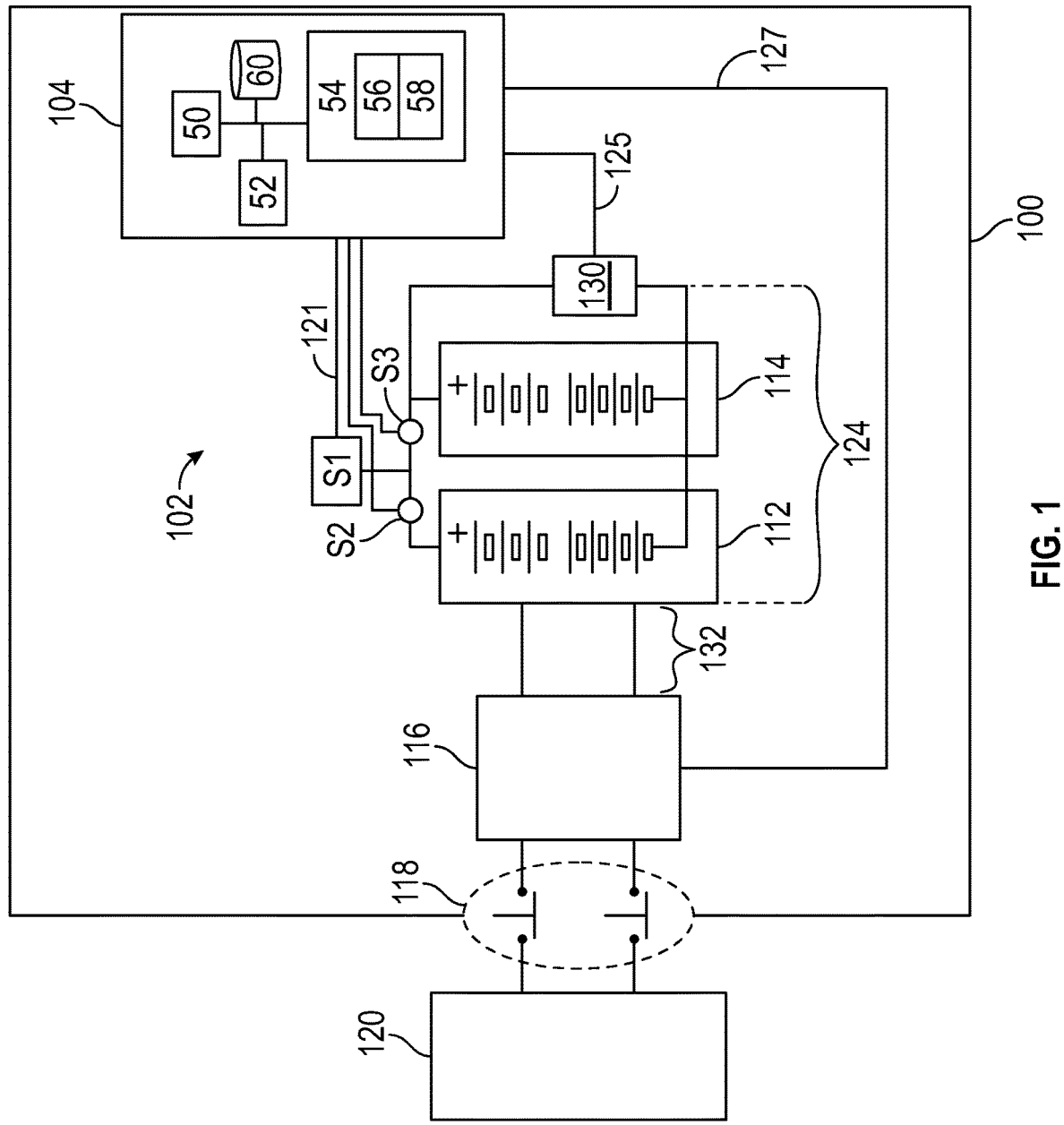
FIGS. 1-3 are schematic diagrams illustrating various embodiments of a system for diagnosing health of a battery using in-vehicle impedance analysis.

The following detailed description is merely exemplary in nature and is not intended to limit the application and uses. Furthermore, there is no intention to be bound by any expressed or implied theory presented in the preceding technical field, background, summary, or the following detailed description.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, machine learning classifiers, or the like, which may carry out a variety of functions under the control of one or more microprocessors or other control devices.

As used herein, the term "module" may refer to any hardware, software, firmware, electronic control component, processing logic, and/or processor device, individually or in any combination. In various embodiments, a module is one or more of: an application specific integrated circuit (ASIC), a field-programmable gate-array (FPGA), an electronic circuit, a computer system comprising a processor (shared, dedicated, or group) and memory that executes one or more software or firmware programs, a combinational logic circuit, and/or other suitable components that provide the functionality attributed to the module.

For the sake of brevity, conventional techniques related to signal processing, data transmission, signaling, control, machine learning models, radar, lidar, image analysis, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

As mentioned, battery health and performance are generally characterized by the impedance of a battery's component battery cells. Available methods to measure a battery cell impedance include electrochemical spectrum analysis. However, electrochemical spectrum analysis requires a high cost "dedicated" impedance analyzer for each individual vehicle, as well as involving the technical complexities of integrating dedicated battery impedance measurement equipment in a vehicular application (e.g., requiring short wiring distances and operating in the presence of on-board vehicle electrical noise).

Embodiments provide a low-cost technical solution to this technical problem. Embodiments utilize onboard components to generate a current with an appropriate current profile to charge/discharge the battery at varying frequencies to perform in-vehicle impedance analysis. The provided current pulse generation algorithms (e.g., encoded in program 56 FIG. 1), utilize existing onboard charging module (OBCM) functions or a single semiconductor switch (e.g., an IGBT or MOSFET switch). The impedance analysis provided by embodiments can advantageously be integrated within an overarching battery charging/discharging/service (for home use or for dealership use). Further, the impedance analysis provided by embodiments can advantageously be integrated within a manufacturing process to monitor each cell for diagnosis and prognosis purposes.

FIG. 1 is a functional block diagram depicting an exemplary system 102 for diagnosing health of a battery 124 using in-vehicle impedance analysis, as may be found on a mobile platform. The mobile platform may be autonomous or semi-autonomous. The mobile platform may be a vehicle 100 that is powered by the battery system 124 and capable of movement, towing, and carrying passengers from one location to another. In various embodiments, the system 102 may be integrated within an onboard battery management system and/or a collective drive systems functional block, which generally includes known vehicle systems for vehicle operation, such as, a propulsion system, a transmission system, a steering system, actuators for the wheels, and a brake system, and generates a variety of signals, including vehicle speed and vehicle acceleration.

In various embodiments, the battery 124 may be managed with an on-board charging module 116 (OBCM 116) and be charged via a plug-in contact 118 to a charging station 120.

The system 102 for diagnosing health of a battery using in-vehicle impedance analysis, shown generally as system 102, includes a controller circuit 104 operationally coupled to the battery 124. In various embodiments, the controller circuit 104 is also communicatively coupled to various other onboard systems and components, for example, the OBCM 116.

The controller circuit 104 may obtain information from and about battery 124, and its one or more battery cells (shortened herein to "cell", e.g., cell 112, cell 114), via sensor input from one or more sensors S1-S3. In the non-limiting example depicted in FIG. 1, sensor 1 (S1) is configured to sense current across a battery cell and provide a sensed current measurement 121 to the controller circuit 104; voltage sensor S2 is configured to provide a voltage measurement for cell 112; and voltage sensor S3 is configured to provide a voltage measurement for cell 114. As may be appreciated by those with skill in the art, battery 124 may have multiple J cells, not shown, each having a respective voltage sensor; in this scenario, individual cells are denoted cellj for j equals 1 to j equals J.

The controller circuit 104 generates a current profile as a function of the received sensed current measurement 121. The current profile is defined by, or includes a series of pulses to a peak current, the pulses having a pulse frequency w. The controller circuit 104 may reference stored parameters 58 or storage database 60 to retrieve the peak current value and the pulse frequency w. In some scenarios, the peak current may be a function of a type of battery.

In embodiments of the system 102, the processor 50 applies a current with a specifically generated current profile to at least one cell (e.g., to cell 112) of the battery 124. As is described in more detail below, embodiments of the system 102 apply the current with the current profile to the at least one cell 112 either by commanding an on-board charging module (OBCM) (e.g., via controls 127) in accordance with the current profile, or by utilizing pulse width modulation (PWM) techniques to control a switch (FIG. 2, 108) coupled across the cell 112 (via controls 125).

Responsive to a pulse applied, the processor 50 receives, from a voltage sensor such as S2, a voltage measurement for the cell 112. The processor 50 calculates an impedance for the cell 112 based on the pulse (of current) applied and the voltage measurement. As is commonly known, the impedance comprises a real component at the frequency (RZw) and an imaginary component at the frequency (IZw). In practice, responsive to each pulse in the current profile that is applied, the processor 50 receives, from a voltage sensor such as S2, a voltage measurement for the cell 112. The processor 50 calculates an impedance for the cell 112 responsive thereto, the impedance comprising RZw and an imaginary component at the IZw. The processor 50 identifies a battery health problem based on the impedance from the cell 112 when either RZw exceeds a preprogrammed first threshold for the frequency, or when IZw exceeds a preprogrammed second threshold for the frequency. The first threshold is a threshold for the real component, the second threshold is a threshold for the imaginary component. The processor 50 also stores the RZw and the IZw for the cell 112. The stored RZw and IZw may become part of a historical record for cell 112, and the processor 50 can also use the historical record to identify a cell 112 health problem, (e.g., by noting variations over time in one or more of RZw and IZw. A cell 112 health problem is, by association, a battery 124 health problem. In this manner, the system 102 diagnoses the batter 124 health using only on-board components.

The processor 50 may repeat this series of tasks responsive to each pulse being applied to the battery 124, and in some embodiments, after completing a preprogrammed number of pulses, the processor 50 also calculates an average real component at the frequency w; for a respective cellj and identifies a battery health problem further when an RjZw exceeds the average real component at the frequency by more than a first threshold. In various embodiments, the processor 50 also calculates an average imaginary component at the frequency; and further identifies a battery health problem when an IjZw exceeds the average imaginary component at the frequency by more than a second threshold.

As can be appreciated, embodiments of the present disclosure may utilize multiple frequencies. In various embodiments, the pulse frequency w, is one of a plurality/of pulse frequencies, and the processor 50 generates the current profile to further include a respective series of pulses to the peak current at each pulse frequency In this scenario, there are W pulse frequencies, and individual pulse frequencies are denoted $w_i$ for i equals 1 to i equals I. In a non-limiting example, the plurality of pulse frequencies covers an entire low to high frequency response range of a battery and includes 0.1 Hz, 10 Hz, 100 Hz and 1 KHz. In embodiments generating multiple frequencies, various frequencies can be combined to create additional frequencies, in accordance with conventionally available pulse generation techniques.

As can also be appreciated by those with skill in the art, in embodiments in which cell 112 and cell 114 are two of multiple J cells of the battery 124, the processor 50 may be further programmed to perform the steps of applying the current, receiving voltage measurements responsive to pulses of current, calculating a respective impedance, and identifying battery health problems based on impedance, as well as storing impedance values, for each cell j equals 1 to j equals J, and for each pulse frequency $w_i$.

In various embodiments, as shown in FIG. 1, the controller circuit 104 is realized as an enhanced computer system, comprising computer readable storage device or media, memory 54, for storage of instructions, algorithms, and/or programs 56, such as an impedance analysis algorithm and operating parameters 58, such as, preprogrammed peak currents and pulse frequencies, for various battery types, and respective voltage and current thresholds. The controller circuit 104 also includes a processor 50 to execute the program 56, and an input/output interface (I/O) 52. The computer readable storage device or media, memory 54, may include volatile and nonvolatile storage in read-only memory (ROM), random-access memory (RAM), and keep-alive memory (KAM), for example. KAM is a persistent or non-volatile memory that may be used to store various operating variables while the processor 50 is powered down. The memory 54 may be implemented using any of several known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the processor 50 in controlling the vehicle 100. In various embodiments, processor 50 is configured to implement the system 102. The memory 54 may also be utilized by the processor 50 to cache data, to temporarily store results of comparisons and analyses, and the like. Information in the memory 54 may be organized and/or imported from an external source during an initialization or installment operation in a method; it may also be programmed via a user I/O interface. In various embodiments, a storage database 60 may also be part of the controller circuit 104.

The input/output interface (I/O) 52 may be operationally coupled to the processor 50 via a bus and enables intra-circuit communication as well as extra-circuit communication. The input/output interface (I/O) 52 may include one or more wired and/or wireless network interfaces and can be implemented using any suitable method and apparatus. In various embodiments, the input/output interface (I/O) 52 includes the hardware and software to support one or more communication protocols for wireless communication between the processor 50 and external sources, such as satellites, the cloud, communication towers and ground stations. In various embodiments, the input/output interface (I/O) 52 supports communication with technicians, and/or one or more storage interfaces for direct connection to storage apparatuses.

During operation of the system 102, the processor 50 loads and executes one or more algorithms, instructions, and rules embodied as program 56, and, as such, controls the general operation of the system 102. In various embodiments of the system 102, the controller circuit 104 may: perform operations attributed to the system 102 in accordance with an algorithm; perform operations in accordance with state machine logic; and perform operations in accordance with logic in a programmable logic array.

While the exemplary embodiment of the system 102 is described in the context of the controller circuit 104 implemented as a fully functioning enhanced computer system, those skilled in the art will recognize that the mechanisms of the present disclosure are capable of being distributed as a program product including program 56 and predefined parameters. Such a program product may comprise an arrangement of instructions organized as multiple interdependent program code modules, each configured to achieve a separate process and/or perform a separate algorithmic operation, arranged to manage data flow through the system 102. The program code modules may each comprise an ordered listing of executable instructions for implementing logical functions for the processes performed by the system 102. The instructions in the program code modules, when executed by a processor (e.g., processor 50), cause the processor to receive and process signals, and perform logic, calculations, methods and/or algorithms as described herein for automatically and in real-time performing vehicle-target localization and generating associated commands.

Once developed, the program code modules constituting a program product may be stored and distributed individually, or together, using one or more types of non-transitory computer-readable signal bearing media may be used to store and distribute the instructions, such as a non-transitory computer readable medium. Such a program product may take a variety of forms, and the present disclosure applies equally regardless of the type of computer-readable signal bearing media used to carry out the distribution. Examples of signal bearing media include recordable media such as floppy disks, hard drives, memory cards and optical disks, and transmission media such as digital and analog communication links. It will be appreciated that cloud-based storage and/or other techniques may also be utilized as memory and as program product time-based viewing of clearance requests in certain embodiments.

Figure 2:
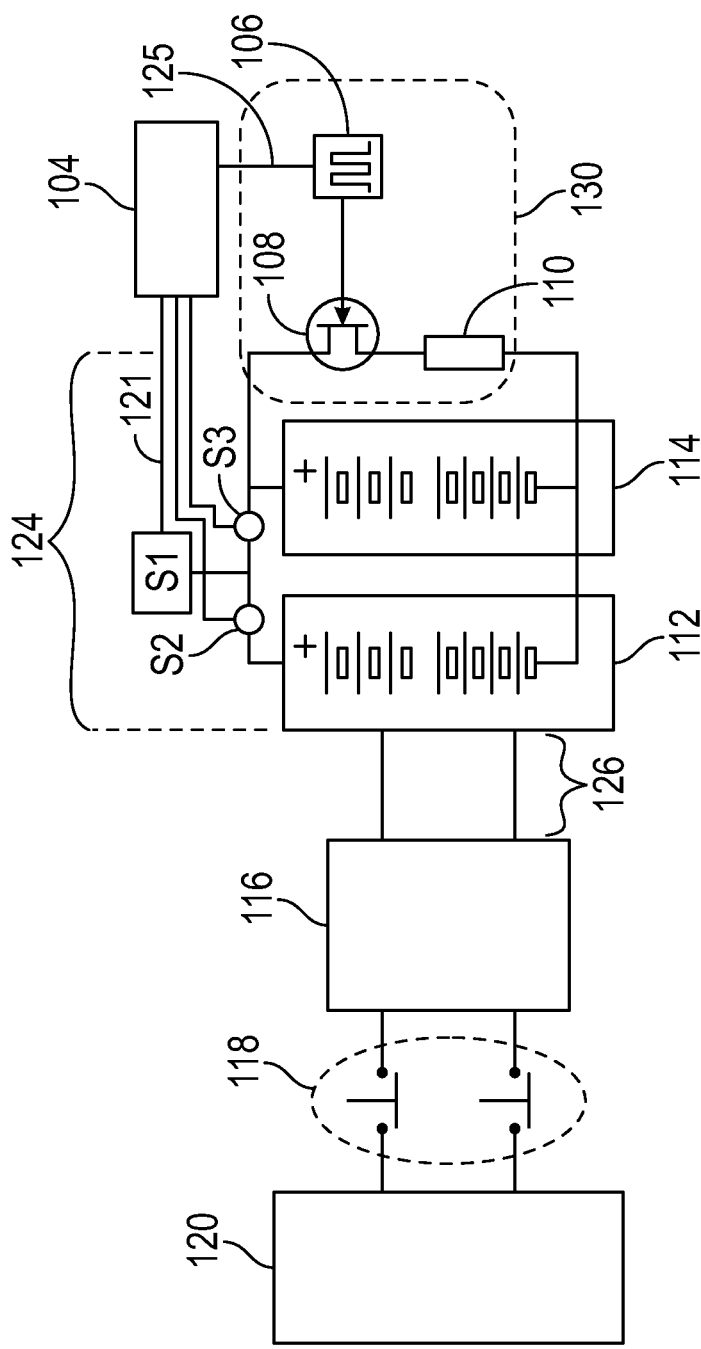

As mentioned above, and with respect to FIG. 2, some embodiments of the system 102 apply the current with the current profile to the battery 124 and the cells via controls 125. FIG. 2 illustrates the output controls 125 are input to the pulse generator module 130. Pulse generator module 130 may include a pulse generator circuitry 106, a switch 108 that has two settings (ON/OFF, or open/closed), and a resistor 110. Output controls 125 are generated to cause a pulse generator circuitry 106 within pulse generator module 130 to output a pulse that controls (ON/OFF) the switch 108. In an embodiment, the switch 108 may be a semiconductor switch receiving the output of the pulse generator circuitry 106 on its gate, with its source coupled to the cathode of battery 124 and its drain is coupled, via a resistor 110, to the anode of the battery 124. When the switch 108 is on, a current path is enabled across one or more cells.

The pulse generator circuitry 106 may be implemented in various ways. In an embodiment, a pulse generator of a first frequency, a pulse generator of a second frequency, and a pulse generator of a third frequency (e.g., w1, w2, and w3 for I=3 frequencies) each provide input into a multiport switch controlled with a clock, and the output of the multiport switch is the signal used to control the switch 108. In other embodiments, sinusoidal signals may be used to generate the pulses. In another embodiment for the pulse generator circuitry 106, it controls the switch 108 through a PWM modulation, where a desired sinusoid current profile for a given frequency w, is subtracted from a high frequency response range for the battery (e.g. 10 kHz) sinusoid signal with the same peak current values. The positive and negative errors from the comparison or subtraction may be used to control the ON or OFF of the switch 108. As a result, the measured current from the sensor S1 will follow the sinusoid current profile for the given frequency w.

Figure 3:
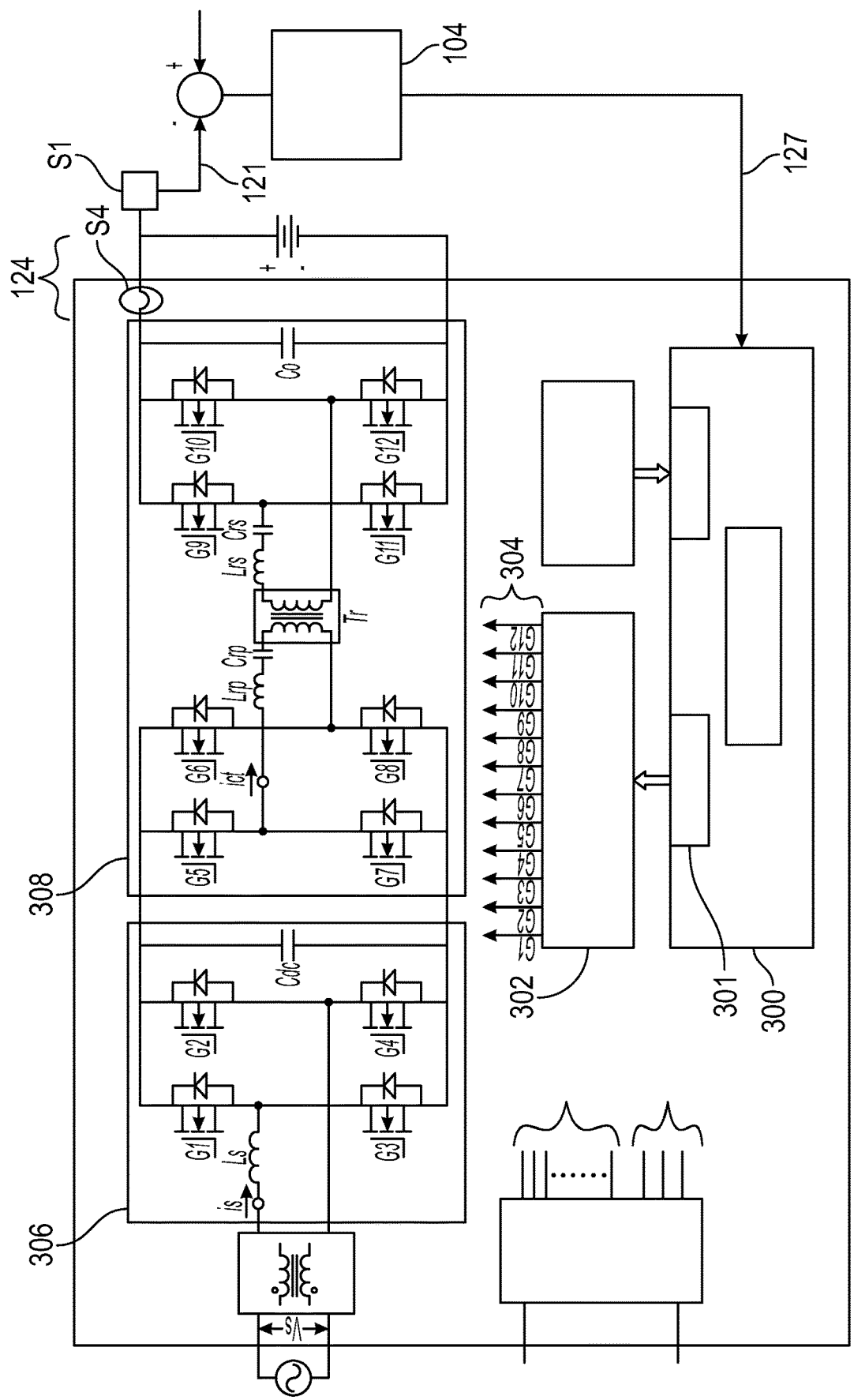

As shown in FIG. 3, and with continued reference to FIGS. 1-2, some embodiments of the system 102 apply the current with the current profile to the battery 124 and the cells via controls 127. In these embodiments, controls 127 are inputs to the existing OBCM 300, and outputs from the OBCM 300, which are responsive to controls 127 and shown generally as signals 132 in FIG. 1, include individual gate controls for N gates (304) numbered G1 to GN, which are driven by one or more pulse width modulators (PWMs 301). In these embodiments a plurality of MOSFET gate drivers with isolation (block 302) may drive the Nsemiconductor gates in an existing onboard bidirectional AC-DC converter 306 and in an existing onboard bidirectional isolated DC-DC converter 308. In the non-limiting example depicted in FIG. 3, block 302 controls G1 to G12, and G1 to G4 are gates in AC-DC converter 30 whereas G5 to G12 are gates in DC-DC converter 308. The target current profile is compared with the measured battery current S1, the error is used to control gates G1-G12 at a given time, such that the output current 132 can exactly follow the current profile with frequency w, as described above.

Figure 4:
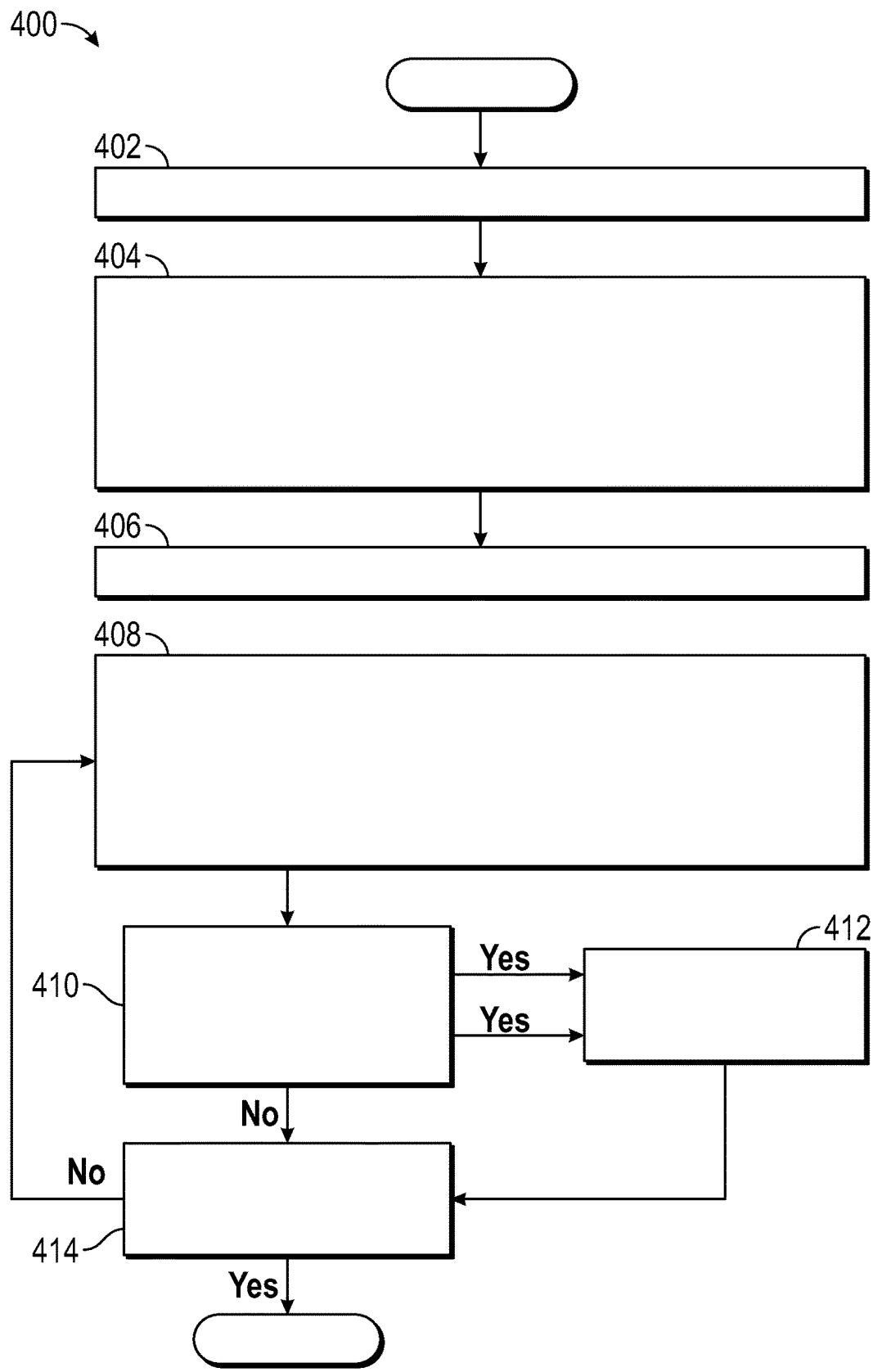
FIG. 4. provides a process flow chart depicting an example method for diagnosing health of a battery using in-vehicle impedance analysis, in accordance with various embodiments.

Turning now to FIG. 4, and with continued reference to FIGS. 1-3, a method 400 for diagnosing a battery cell and that may be performed by the system 102 is shown. For illustrative purposes, the following description of the method 400 may refer to elements mentioned above in connection with FIGS. 1-3. In various embodiments, portions of method 400 may be performed by different components of the described system 102. It should be appreciated that method 400 may include any number of additional or alternative operations and tasks, the tasks shown in FIG. 4 need not be performed in the illustrated order, and method 400 may be incorporated into a more comprehensive procedure or method having additional functionality not described in detail herein, such as during home charging of an electric vehicle, during DCFC fast charging, during a service procedure or when vehicle is driving. For example, the method can interrupt home charging at every 20% state of charge (SOC) incremental to monitor cell state of health or stop charging when a serious fault condition is found for one of the cells. Moreover, one or more of the tasks shown in FIG. 4 could be omitted from an embodiment of the method 400 if the intended overall functionality remains intact.

The sensed current measurement 121 is received at 402. At 404, the current profile is generated; and the current profile is defined by a peak current and a frequency. As described above, a current with this current profile will be generated to have a plurality of pulses at the frequency, and each pulse will rise to the peak current before being cut off responsive to controls from the system 102. Also as described, in various embodiments, the current profile can be a function of a battery type. In other embodiments, the current profile can include more than one frequency.

At 406, a current with the current profile is applied to the battery 124. As described above, this task may be performed by controlling MOSFET gate drivers (block 302) in the OBCM 300 or by controlling a pulse generator module 130. In practice, this looks like applying current pulses to the battery 124.

At 408, impedance for the battery 124, or for at least one cell of the battery 124, is determined from the corresponding frequency components of the sensed current measurement 121 and sensed voltage on a pulse-by-pulse basis of the at least one cell. For example, the current pulse is applied to the battery 124, the voltage responsive thereto is sensed, and the impedance is generated based thereon. As mentioned, this is generally per cell. The impedance at the frequency is denoted Zw, and it includes a real component RZw and an imaginary component IZw. The RZw and the IZw may be stored in a historical database and may further be stored with a respective battery state of charge and battery temperature, for future reference.

At 410, if RZw exceeds a first threshold (RT) for the frequency w, the method 400 identifies a battery health problem at 412. Also, if IZw exceeds a second threshold (IT) for the frequency w, the method 400 identifies a battery health problem at 412.

At 414, if the current profile (having its multiple pulses, perhaps at multiple frequencies) is not completed, the method may return to 408.

In various optional steps, the method 400 may process the RZw and the IZw using a classification technique to thereby obtain a fault type from among internal short, diffusion problem, and layer aging. In various embodiments, non-limiting examples of the classification technique include a trained convergent neural net (CNN), a random forest search, or historical data mining.

Also, in various embodiments, the method 400 may store the RZw and the IZw of the cell further with a respective temperature and state of charge (SOC), in a historical data storage; and identify or prognose the battery health problem further as a function of detected variations in the RZw and the IZw for the cell over time.

Thus, the provided system 102 and method 400 for diagnosing health of a battery using in-vehicle impedance analysis provides a technological solution to the technical problems of diagnosis health of a battery by using in-vehicle impedance analysis. The capability provided by these embodiments supports impedance analyzing of a battery in a mobile platform using only onboard components. Embodiments eliminate a reliance on costly lab environments to perform electrochemical analysis of a battery.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. Various changes can be made in the function and arrangement of elements without departing from the scope of the disclosure as set forth in the appended claims and the legal equivalents thereof.

What is claimed is:

1. A method for diagnosing health of a battery using in-vehicle impedance analysis, the method comprising:
   receiving a sensed current measurement for at least one cell of the battery;
   generating a current profile as a function of the sensed current measurement, the current profile comprising multiple pulses to a peak current, the multiple pulses having a pulse frequency;
   applying a current with the current profile to the at least one cell;
   responsive to a pulse in the current profile, receiving a voltage measurement for the at least one cell, calculating a respective impedance for the at least one cell based thereon, the impedance comprising a real component at the pulse frequency and an imaginary component at the pulse frequency, storing the real component at the pulse frequency and the imaginary component at the pulse frequency for the at least one cell, and identifying a battery health problem when either the real component at the pulse frequency exceeds a preprogrammed first threshold for the pulse frequency, or when the imaginary component at the pulse frequency exceeds a preprogrammed second threshold for the pulse frequency;
   for each pulse of the multiple pulses in the current profile, repeating the receiving, calculating, storing, and identifying;
   calculating an average real component at the pulse frequency; and
   identifying the battery health problem further when the real component at the pulse frequency exceeds the average real component at the pulse frequency by more than a first threshold.

2. The method of claim 1, further comprising:
   calculating an average imaginary component at the pulse frequency; and
   further identifying the battery health problem when the imaginary component at the pulse frequency exceeds the average imaginary component at the pulse frequency by more than a second threshold.

3. The method of claim 1, further comprising applying the current with the current profile to the at least one cell either by commanding an on-board charging module (OBCM) in accordance with the current profile, or by utilizing pulse width modulation (PWM) to control a respective switch coupled across the at least one cell.

4. The method of claim 1, wherein the pulse frequency is one of a plurality of pulse frequencies, and further comprising generating the current profile to further include a respective series of pulses to the peak current at each of the plurality of pulse frequencies.

5. The method of claim 4, wherein the plurality of pulse frequencies covers an entire low to high frequency response range of a battery, including 0.1 Hz, 10 Hz, 100 Hz, and 1 KHz.

6. The method of claim 1, further comprising:
determining a battery type for the battery; and
generating the current profile further as a function of the battery type.

7. The method of claim 1, further comprising,
determining an error between the sensed current measurement and the peak current; and
generating the current profile further as a function of the error.

8. The method of claim 1, further comprising:
processing the real component at the pulse frequency and the imaginary component at the pulse frequency using a classification technique to thereby obtain a fault type from among internal short, diffusion problem, and layer aging.

9. The method of claim 8, wherein the classification technique is a trained convergent neural net, a random forest search, or historical data mining.

10. The method of claim 1, further comprising:
storing the real component at the pulse frequency and the imaginary component at the pulse frequency of the at least one cell further with a respective temperature and state of charge, in a historical data storage; and
identifying the battery health problem further as a function of detected variations in the real component at the pulse frequency or the imaginary component at the pulse frequency over time.

11. A system for diagnosing health of a battery using in-vehicle impedance analysis, the system comprising:
a sensor configured to provide a sensed current measurement for at least one cell of the battery;
a processor operationally coupled to the sensor and programmed to:
receive the sensed current measurement;
generate a current profile as a function of the sensed current measurement, the current profile including pulses to a peak current, the pulses having a pulse frequency;
apply a current with the current profile to the at least one cell;
responsive to a pulse in the current profile, receive a voltage measurement for the at least one cell, calculate an impedance for the at least one cell based thereon, the impedance comprising a real component at the pulse frequency and an imaginary component at the pulse frequency, store the real component at the pulse frequency and the imaginary component at the pulse frequency for the at least one cell, and identify a battery health problem when either the real component at the pulse frequency exceeds a preprogrammed first threshold for the pulse frequency, or when the imaginary component at the pulse frequency exceeds a preprogrammed second threshold for the pulse frequency; and
apply the current with the current profile to the at least one cell either by commanding an on-board charging module (OBCM) in accordance with the current profile, or by utilizing pulse width modulation (PWM) to control a respective switch coupled across the at least one cell.

12. The system of claim 11, wherein the processor is further programmed to: for each pulse of the current profile, repeat the receiving, calculating, storing, and identifying.

13. The system of claim 12, wherein the processor is further programmed to:
calculate an average real component at the pulse frequency; and
identify the battery health problem further when the real component at the pulse frequency exceeds the average real component at the pulse frequency by more than a first threshold.

14. The system of claim 13, wherein the processor is further programmed to:
calculate an average imaginary component at the pulse frequency; and
identify the battery health problem further when the imaginary component at the pulse frequency exceeds the average imaginary component at the pulse frequency by more than a second threshold.

15. The system of claim 11, wherein the pulse frequency, w, is one of a plurality of pulse frequencies, and wherein the processor is further programmed to generate the current profile to further include a respective series of pulses to the peak current at each of the plurality of pulse frequencies.

16. The system of claim 11, wherein the processor is further programmed to:
determine an error between the sensed current measurement and the peak current;
generate the current profile further as a function of the error;
store the real component at the pulse frequency and the imaginary component at the pulse frequency of the at least one cell further with a respective temperature and state of charge, in a historical data storage; and
identify the battery health problem further as a function of detected variations in the real component at the pulse frequency or the imaginary component at the pulse frequency over time.

17. The system of claim 16, further comprising:
processing the real component at the pulse frequency and the imaginary component using a classification technique to thereby obtain a fault type from among internal short, diffusion problem, and layer aging.

18. A system for diagnosing health of a battery using in-vehicle impedance analysis, the system comprising:
a sensor configured to provide a sensed current measurement for at least one cell of the battery;
a processor operationally coupled to the sensor and programmed to:
receive the sensed current measurement;
generate a current profile as a function of the sensed current measurement, the current profile including pulses to a peak current, the pulses having a pulse frequency;
apply a current with the current profile to the at least one cell;
responsive to a pulse in the current profile, receive a voltage measurement for the at least one cell, calculate an impedance for the at least one cell based thereon, the impedance comprising a real component at the pulse frequency and an imaginary component at the pulse frequency, store the real component at the pulse frequency and the imaginary component at the pulse frequency for the at least one cell, and identify a battery health problem when either the real component at the pulse frequency exceeds a preprogrammed first threshold for the pulse frequency, or when the imaginary component at the pulse frequency exceeds a preprogrammed second threshold for the pulse frequency;

for each pulse of the current profile, repeat the receiving, calculating, storing, and identifying;
calculate an average real component at the pulse frequency; and
identify the battery health problem further when the real component at the pulse frequency exceeds the average real component at the pulse frequency by more than a first threshold.

19. The system of claim 18, wherein the pulse frequency, w, is one of a plurality of pulse frequencies, and wherein the processor is further programmed to generate the current profile to further include a respective series of pulses to the peak current at each of the plurality of pulse frequencies.

20. The system of claim 18, wherein the processor is further programmed to:
determine an error between the sensed current measurement and the peak current;
generate the current profile further as a function of the error;
store the real component at the pulse frequency and the imaginary component at the pulse frequency of the at least one cell further with a respective temperature and state of charge, in a historical data storage; and
identify the battery health problem further as a function of detected variations in the real component at the pulse frequency or the imaginary component at the pulse frequency over time.

* * * * *